United States Patent
Freitag et al.

(10) Patent No.: US 7,038,889 B2
(45) Date of Patent: May 2, 2006

(54) METHOD AND APPARATUS FOR ENHANCED DUAL SPIN VALVE GIANT MAGNETORESISTANCE EFFECTS HAVING SECOND SPIN VALVE SELF-PINNED COMPOSITE LAYER

(75) Inventors: James Mac Freitag, San Jose, CA (US); Hardayal Singh Gill, Palo Alto, CA (US); Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/260,971

(22) Filed: Sep. 30, 2002

(65) Prior Publication Data

US 2004/0061977 A1 Apr. 1, 2004

(51) Int. Cl.
*G11B 5/39* (2006.01)
(52) U.S. Cl. ............. 360/314; 360/324.11; 360/324.12
(58) Field of Classification Search ................ 360/314, 360/324.11, 324.12
See application file for complete search history.

(56) References Cited

U.S. PATENT DOCUMENTS

| 5,583,725 A | 12/1996 | Coffey et al. |
| 5,748,399 A | 5/1998 | Gill |
| 5,768,069 A | 6/1998 | Mauri |
| 5,825,595 A | 10/1998 | Gill |
| 5,856,897 A | 1/1999 | Mauri |
| 5,880,913 A | 3/1999 | Gill |

(Continued)

FOREIGN PATENT DOCUMENTS

JP   2000-040211   2/2000

OTHER PUBLICATIONS

Zhu, J.G. "Spin Valve and Dual Spin Valve Heads with Synthetic Antiferromagnets," IEEE Transactions on Magnetics, vol. 35, No. 2, Mar. 1999, pp. 655-660.

(Continued)

*Primary Examiner*—Craig A. Renner
(74) *Attorney, Agent, or Firm*—Chambliss, Bahner & Stophel, P.C.; David W. Lynch (57) ABSTRACT

A dual spin valve giant magnetoresistance (GMR) sensor having two spin valves with the second spin valve being self-biased is disclosed herein. According to the present invention a dual spin valve system is disclosed wherein the first of the two spin valves in the dual spin valve element is pinned through exchange coupling, i.e., a first anti-ferromagnetic pinning layer and a first ferromagnetic pinned layer structure are exchange coupled for pinning the first magnetic moment of the first ferromagnetic pinned layer structure in a first direction. The second of the two spin valves in the dual spin valve system is self-pinned. The self-pinned spin valve does not use any anti-ferromagnetic layers to pin the magnetization of the pinned layers.

35 Claims, 8 Drawing Sheets

U.S. PATENT DOCUMENTS

| | | |
|---|---|---|
| 5,966,323 A | 10/1999 | Chen et al. |
| 6,111,729 A | 8/2000 | Kamiguchi et al. |
| 6,153,320 A | 11/2000 | Parkin |
| 6,175,476 B1 | 1/2001 | Huai et al. |
| 6,219,208 B1 | 4/2001 | Gill |
| 6,221,172 B1 | 4/2001 | Saito et al. |
| 6,317,297 B1 * | 11/2001 | Tong et al. .................. 360/314 |
| 6,650,509 B1 * | 11/2003 | Gill ........................ 360/324.12 |
| 6,741,432 B1 * | 5/2004 | Pinarbasi ............... 360/324.11 |
| 6,781,798 B1 * | 8/2004 | Gill ............................ 360/314 |
| 6,785,102 B1 * | 8/2004 | Freitag et al. .............. 360/314 |

OTHER PUBLICATIONS

Zhu, J.G. et al. "Micromagnetics of Dual Spin Valve GMR Heads," J. Appl. Physics, vol. 79, No. 8, Part 2B, Apr. 1996, pp. 5886-5888.

Gill, "Dual Spin Valve Sensor Without AFM Pinning," U.S. Appl. No. 09/813,609 filed Mar. 20, 2001.

* cited by examiner

METHOD AND APPARATUS FOR ENHANCED DUAL SPIN VALVE GIANT MAGNETORESISTANCE EFFECTS HAVING SECOND SPIN VALVE SELF-PINNED COMPOSITE LAYER

BACKGROUND OF THE INVENTION

1. Field of the Invention

This invention relates in general to dual spin valve heads for magnetic storage systems, and more particularly to a method and apparatus for enhanced dual spin valve giant magnetoresistance (GMR) effects using two spin valves with the second spin valve having a self-pinned composite layer.

2. Description of Related Art

The size and complexity of operating systems, user applications and data files continues to increase. As a result, the importance of magnetic storage systems is also increasing. To increase storage capacity, the performance of magnetic heads is one focus of much research. Magnetic heads are used for writing and reading data on magnetic recording media. Anisotropic Magnetoresistive (AMR) technology has been the primary, high performance read technology. An AMR head employs a special conductive material that changes its resistance in the presence of a magnetic field. As the head passes over the surface of the disk, this material changes resistance as the magnetic fields change corresponding to the stored patterns on the disk. A sensor is used to detect these changes in resistance, which allows the bits on the platter to be read.

However, even AMR heads have a limit in terms of how much areal density they can handle. Successive generations of AMR heads were reduced in size to allow still greater areal density. Sometimes these more advanced designs were dubbed MRX for Extended Magnetoresistive heads. However, giant magnetoresistive (GMR) heads is the current focus in the logical progression of the storage industry's endless quest for a way to increase areal density while reducing the price per megabyte.

A typical GMR head design consists of a thin film inductive write element and a read element. The read element consists of an GMR sensor between two magnetic shields. The magnetic shields greatly reduce unwanted magnetic fields coming from the disk; the GMR sensor essentially "sees" only the magnetic field from the recorded data bit to be read. In a merged head the second magnetic shield also functions as one pole of the inductive write head. The advantage of separate read and write elements is both elements can be individually optimized. A merged head has additional advantages. This head is less expensive to produce, because it requires fewer process steps; and, it performs better in a drive, because the distance between the read and write elements is less.

During operation, the inductive write head records bits of information by magnetizing tiny regions along concentric tracks on a disk. During reading, the presence of a magnetic transition or flux reversal between bits causes the magnetic orientation in the GMR sensor to change. This in turn, causes the resistance of this sensor to change. The sensor's output voltage or signal is the product of this resistance change and the read bias current. This signal is amplified by low-noise electronics and sent to the HDD's data detection electronics.

GMR sensors are composed of multiple thin films. GMR sensors have a sensing layer, which responds to external magnetic fields. GMR sensors include two magnetic layers separated by a spacer layer chosen to ensure that the coupling between magnetic layers was weak, unlike previously made structures. The magnetic orientation of one of the magnetic layers is also "pinned" in one direction by adding a fourth strong anti-ferromagnetic layer. In this arrangement, the anti-ferromagnetic layer biases one of the magnetic layers. Alternatively, a self-pinned magnetic layer may be used. A self-pinned layer has a magnetic moment which is pinned parallel to the magnetic moment by sense current fields from the conductive layers.

The key structure is a spacer layer of a non-magnetic metal between two magnetic metals. Magnetic materials tend to align themselves in the same direction. So if the spacer layer is thin enough, changing the orientation of one of the magnetic layers can cause the next one to align itself in the same direction. During operation, the magnetic alignment of the magnetic layers swing back and forth from being aligned in the same magnetic direction (parallel alignment) to being aligned in opposite magnetic directions (anti-parallel alignment). The overall resistance is relatively low when the layers are in parallel alignment and relatively high when in anti-parallel alignment. When a weak magnetic field, such as that from a bit on a hard disk, passes beneath such a structure, the magnetic orientation of the unpinned magnetic layer rotates relative to that of the pinned layer, generating a significant change in electrical resistance due to the GMR effect.

A dual spin valve arrangement may also be used. With this arrangement, the magnetoresistive coefficient is increased due to the spin valve effect on each side of the free layer. The dual spin valve sensor typically includes a five layer GMR film. The five layer GMR film includes three ferromagnetic layers separated by two thin conductive metallic layers. The two outer ferromagnetic layers are generally exchange coupled. The pinned layer may have its magnetization pinned by exchange coupling with an anti-ferromagnetic (e.g., NiO or FeMn) layer. Alternatively, a sense current may be used as the means for pinning the pinned layer magnetization as opposed to the use of the conventional anti-ferromagnetic layer.

However, each arrangement has its problems. Sensors formed with two exchange coupled spin valves are too thick due to the presence of thick anti-ferromagnetic pinning layers. This thickness is a disadvantage that severely limits the sensitivity of these sensors to minute changes in the magnetic flux. Still, this dual exchange coupled spin valve sensor has at least one advantage, one being that the magnetic moment pinned through exchange coupling is strongly pinned thereby causing the free layer in the exchange coupled spin valve system to exhibit stable biasing. The result is a reliable, albeit, poorly sensitive, sensor.

The dual spin valve arrangement wherein the dual spin valve sensor is formed with two self pinned spin valves do not require an adjacent anti-ferromagnetic layer to pin the magnetic moment. Advantageously, this type of dual spin valve sensor can be fabricated thinner than the dual exchange coupled spin valve which would lead to a more sensitive sensor. However, the dual self pinned spin valve sensor lacks the stable biasing of the dual exchange coupled spin valve sensor. The result is a sensitive, but unreliable and unstable sensor.

It can be seen that there is a need for a method and apparatus for providing enhanced giant magnetoresistance (GMR) effects to provide increased sensitivity to minute changes in resistance in response to magnetic flux interactions.

SUMMARY OF THE INVENTION

To overcome the limitations in the prior art described above, and to overcome other limitations that will become apparent upon reading and understanding the present specification, the present invention discloses a method and apparatus for enhanced dual spin valve giant magnetoresistance (GMR) effects using two spin valves with the second spin valve being a self-pinned composite layer.

The present invention solves the above described problems via development of a dual spin valve GMR sensor having the second of two spin valves having a self-pinned composite layer that significantly enhances sensing capabilities, refines sensitivity to magnetic flux changes and provides more stable free layer biasing.

Additional advantages result from the sensor being formed with a thinner sensor stack than prior art sensors through the elimination of an anti-ferromagnetic pinning layer. Enhanced sensitivity of the sensor is demonstrated by improved sensitivity ($\Delta R/R$) and increased sheet resistance. Desirable stable free layer biasing is accomplished through implementation of a single exchange coupled composite pinned layer in the dual spin valve sensor of the present invention.

A method in accordance with the principles of the present invention includes forming a first composite pinned layer, the first composite pinned layer being exchange coupled via an anti-ferromagnetic layer, forming a second composite pinned layer, the second composite pinned layer being self pinned to eliminate a need for an anti-ferromagnetic layer to reduce a thickness of the dual spin valve sensor and forming a composite free layer disposed between the first and second composite pinned layers.

In another embodiment of the present invention, a dual spin valve sensor is provided. The dual spin valve sensor includes an antiferromagnetic layer, a first composite pinned layer being exchange coupled via the anti-ferromagnetic layer, a second composite pinned layer, the second composite pinned layer being self pinned to eliminate a need for an anti-ferromagnetic layer to reduce a thickness of the dual spin valve sensor and a composite free layer disposed between the first and second composite pinned layers.

In another embodiment of the present invention, a magnetic storage system is provided. The magnetic storage system includes a magnetic recording medium and a dual spin valve sensor operatively coupled proximate the recording medium, the dual spin valve sensor, including an anti-ferromagnetic layer, a first composite pinned layer being exchange coupled via the anti-ferromagnetic layer, a second composite pinned layer, the second composite pinned layer being self pinned to eliminate a need for an anti-ferromagnetic layer to reduce a thickness of the dual spin valve sensor and a composite free layer disposed between the first and second composite pinned layers.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiments in which the invention may be practiced. It is to be understood that other embodiments may be utilized as structural changes may be made without departing from the scope of the present invention.

The present invention solves the above-described problems by forming a GMR sensor including dual spin valves being formed of composite thin film layers and having a composite thin film free layer sandwiched between the two spin valves, wherein the first of two spin valves in the dual spin valve element is pinned through exchange coupling and the second of two spin valves in the dual spin valve system is self pinned and does not use any anti-ferromagnetic layers to pin the magnetization of the pinned layers. The first and second composite pinned layers have first and second magnetic moments, respectively, wherein the first and second magnetic moments are parallel.

Figure 1:
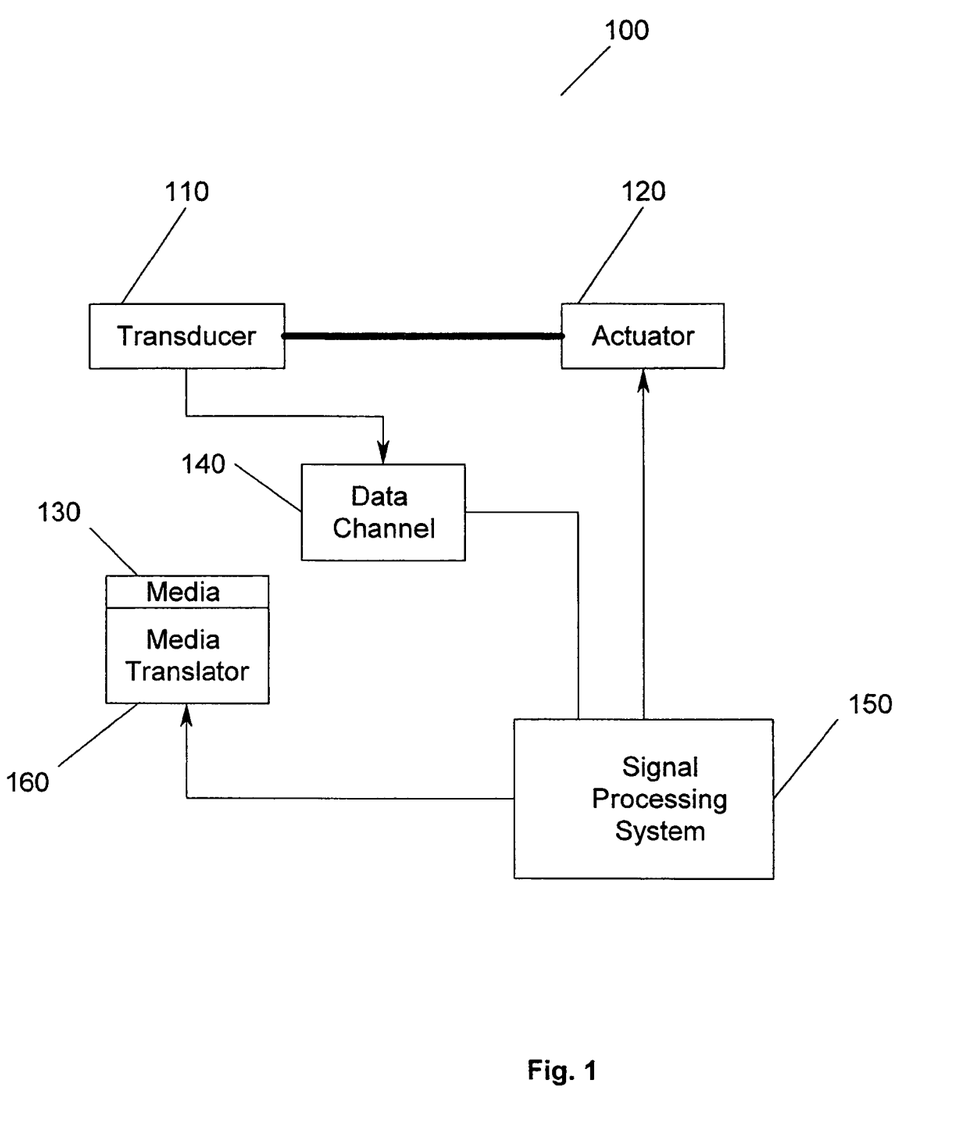
FIG. 1 illustrates a storage system according to the present invention.

FIG. 1 illustrates a storage system 100 according to the present invention. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor 150 controls the actuator 120 and processes the signals of the data channel 140. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
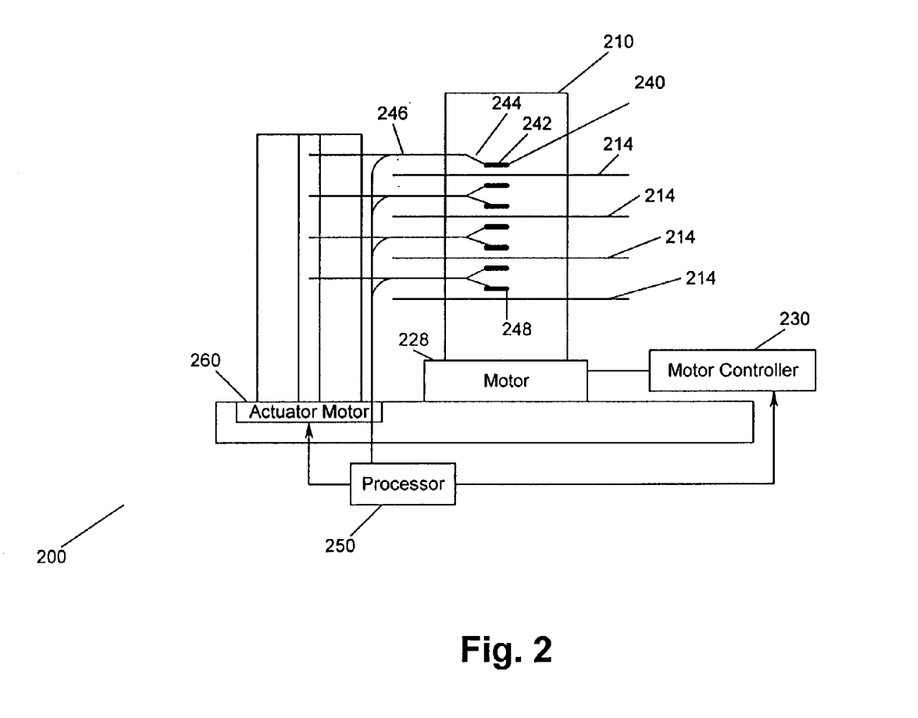
FIG. 2 illustrates one particular embodiment of a storage system according to the present invention.

FIG. 2 illustrates one particular embodiment of a storage system 200 according to the present invention. In FIG. 2, a hard disk drive storage system 200 is shown. The system 200 includes a spindle 210 that supports and rotates a magnetic disk 214. The spindle 210 is rotated by a motor 228 that is controlled by a motor controller 230. A combined read and write magnetic head 240 is mounted on a slider 242 that is supported by a suspension 244 and actuator arm 246. Processing circuitry 250 exchanges signals, representing information, with the head 240, provides drive signals to the motor 228 for rotating the magnetic disk 214, and provides control signals to the actuator motor 260 for moving the slider 242 to various tracks. A plurality of disks 214, sliders 242 and suspensions 244 may be employed in a large capacity direct access storage device.

The suspension 244 and actuator arm 246 position the slider 242 so that the magnetic head 240 is in a transducing relationship with a surface of the magnetic disk 214. When the disk 214 is rotated by the motor 228, the slider 240 is supported on a thin cushion of air (air bearing) between the surface of the disk 214 and the air-bearing surface (ABS) 248. The magnetic head 240 may then be employed for writing information to multiple circular tracks on the surface of the disk 214, as well as for reading information therefrom.

Figure 3:
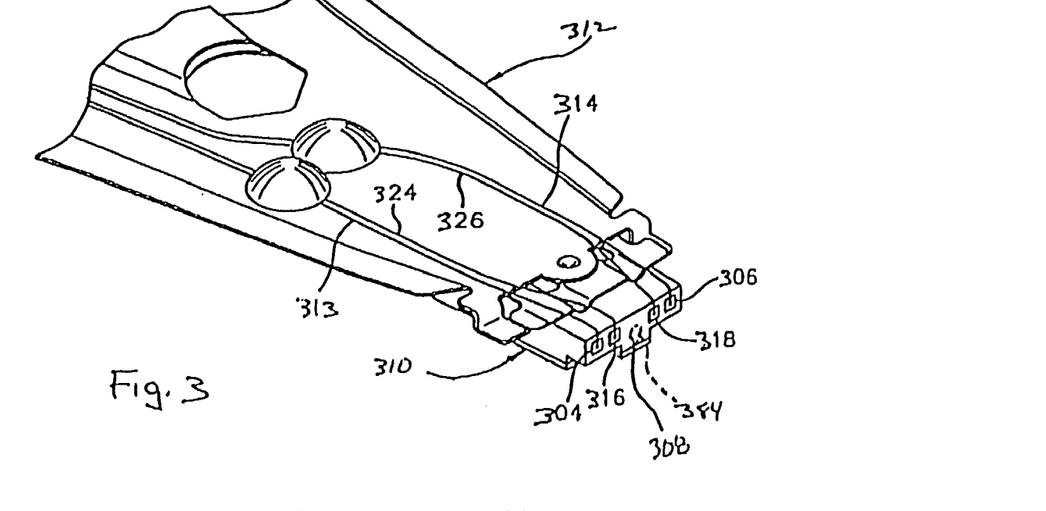
FIG. 3 illustrates a slider mounted on a suspension.

FIG. 3 illustrates a slider 310 mounted on a suspension 312. In FIG. 3 first and second solder connections 304 and 306 connect leads from a GMR sensor 308 to leads 313 and 314 on the suspension 312 and third and fourth solder connections 316 and 318 connect the coil 384 to leads 324 and 326 on the suspension.

Figure 4:
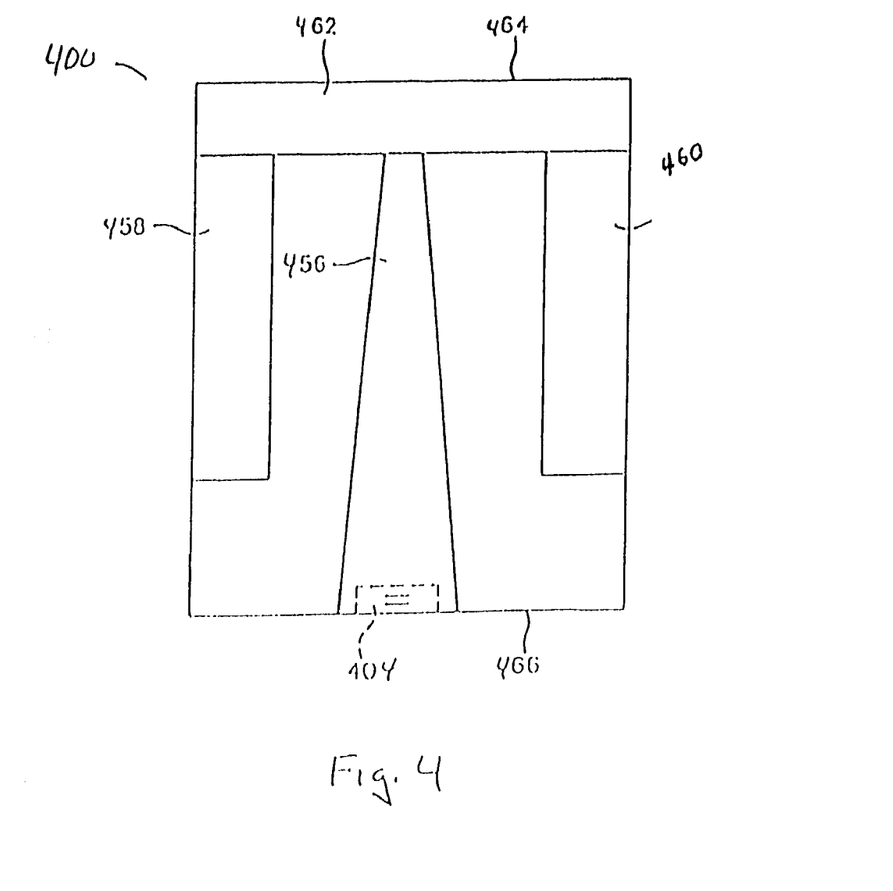
FIG. 4 is an ABS view of the slider and the magnetic head.

FIG. 4 is an ABS view of the slider 400 and the magnetic head 404. The slider has a center rail 456 that supports the magnetic head 404, and side rails 458 and 460. The rails 456, 458 and 460 extend from a cross rail 462. With respect to rotation of a magnetic disk, the cross rail 462 is at a leading edge 464 of the slider and the magnetic head 404 is at a trailing edge 466 of the slider.

The above description of a typical magnetic recording disk drive system, shown in the accompanying FIGS. 1–4, are for presentation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives. Further, the ABS of the slider may be different from that shown in FIG. 4 and the location of the head is not meant to be limited to that shown in FIGS. 3–4.

Figure 5:
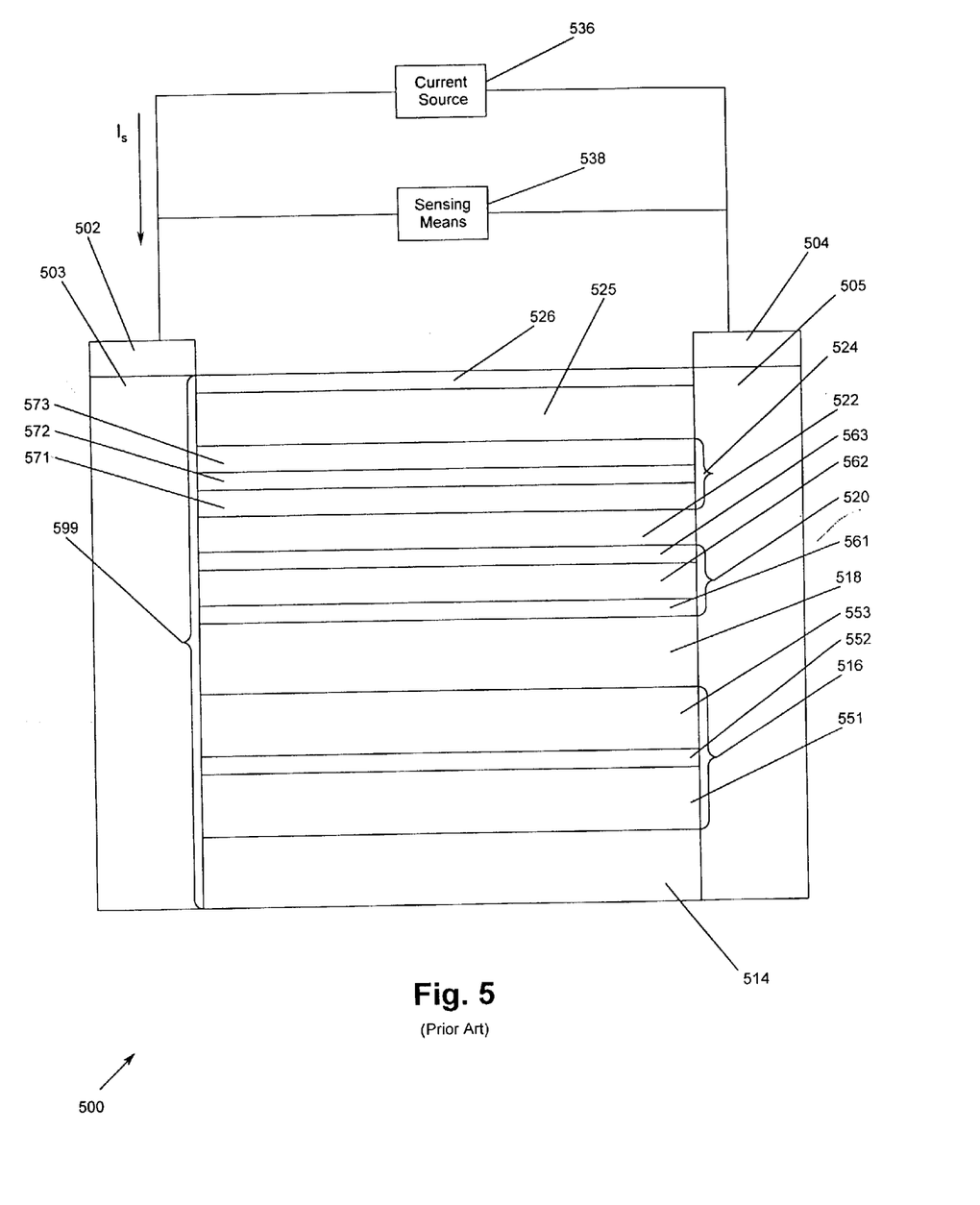
FIG. 5 is a cross sectional view of a known dual spin valve sensor having both magnetic moments being anti-ferromagnetic pinned.

FIG. 5 shows an air bearing surface (ABS) view of a prior art dual spin valve sensor 500 having magnetic moments that are anti-ferromagnetically pinned. The dual spin valve sensor 500 has end regions 502 and 504 separated from each other by a central region. The central region has defined edges where the end regions 502 and 504 form a contiguous junction with and abut the edges. The end regions 502 and 504 forming leads which are formed over hard biased layers 503 and 505, respectively. The leads formed in ends 502 and 504 of dual spin valve sensor 500 provide electrical connection between the dual spin valve sensor 500 and a sense current source 536 and a sensing means 538. The sense current source 536 provides the necessary sense current Is to the dual spin valve sensor element 599 to establish a DC base (bias) voltage across the dual spin valve sensor element 599. The sensing means 538 provides the means for sensing the spin valve effect.

Thin film stacks, which make up spin valve sensors, are grown on a substrate (not shown in the Figs.). Usually, a starter or seed layer (not shown) is initially grown on the substrate, and all additional layers are grown thereon.

The first layer of the prior art dual spin valve sensor is an anti-ferromagnetic pinning layer 514. Disposed upon the anti-ferromagnetic pinning layer 514 is a first composite ferromagnetic pinned layer 516. Elements including the composite layer of the prior art composite ferromagnetic pinned layer are CoFe 551, Ru 552 and CoFe 553.

Disposed on the first ferromagnetic composite pinned layer 516 is a first nonmagnetic electrically conductive spacer layer 518. Disposed on the first nonmagnetic electrically conducting spacer layer 518 is a composite ferromagnetic free layer 520. The composite ferromagnetic free layer 520 includes a composite layer of CoFe 561, NiFe 562 and CoFe 563.

Disposed on the composite ferromagnetic free layer 520 is a second nonmagnetic electrically conducting spacer layer 522. Disposed upon the second nonmagnetic electrically conducting spacer layer 522 is a second composite ferromagnetic pinned layer 524. Elements including the composite layer of the second composite ferromagnetic pinned layer are CoFe 571, Ru 572 and CoFe 573.

Disposed upon the second composite ferromagnetic pinned layer 524 is a second anti-ferromagnetic pinning layer 525. A cap layer 526 is disposed upon the second anti-ferromagnetic pinning layer 525.

Now, regarding FIG. 5, the first composite ferromagnetic pinned layer 516 is disposed adjacent the first anti-ferromagnetic pinning layer 514 and the second ferromagnetic pinned layer 524 is disposed adjacent the second anti-ferromagnetic pinning layer 525. The pinned layers 516, 524 are pinned through exchange coupling with their respective anti-ferromagnetic pinning layers 514 and 525.

Prior art dual spin valve sensors having two anti-ferromagnetically pinned spin valves, as shown in FIG. 5, are disadvantaged because of the great size of the dual spin valve element 599. The anti-ferromagnetic layers (514 and 525) are on the order of a hundred angstroms thick, and often more. Due to the great size of these GMR elements, the sheet resistance is low, thus the sensitivity is low. As sensor sensitivity increases, smaller and smaller magnetic flux interactions are detectable, thus allowing more and more data to be stored on magnetic media. Thus, high sensitivity and sheet resistance are highly desirable.

Figure 6:
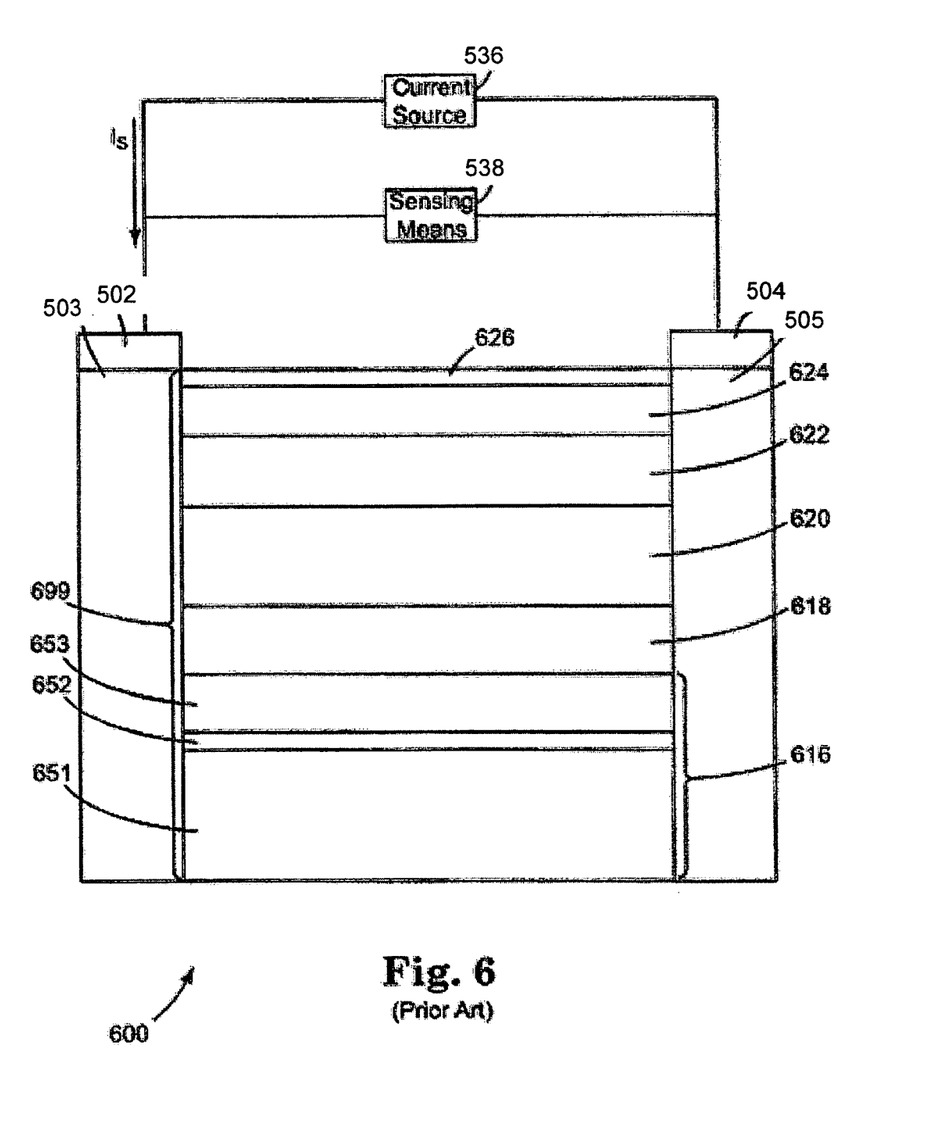
FIG. 6 is a cross sectional view of a known dual spin valve having both magnetic moments being self pinned.

FIG. 6 shows an air bearing surface (ABS) view of a prior art dual spin valve sensor 600 where the magnetic moments of both spin valves are self pinned. The external structure of the dual spin valve sensor 600 bounding the dual spin valve element 699 may be identical to that disclosed in FIG. 5 and will not be repeated.

The first layer of the prior art dual spin valve sensor according to FIG. 6, is a first self pinned composite layer 616. The first self pinned composite layer 616 is a composite layer including layers of NiFe 651, Ru 652 and NiFe 653. Disposed on the first self pinned composite layer 616 is a first nonmagnetic electrically conductive spacer layer 618.

Disposed on the first nonmagnetic electrically conducting spacer layer 618 is a free layer 620 including NiFe. Disposed on the free layer 620 is a second nonmagnetic electrically conducting spacer layer 622. Disposed upon the second nonmagnetic electrically conducting spacer layer 622 is a second self pinned layer 624 including NiFe.

Disposed upon the second self pinned layer 624 is a cap layer 626 disposed as the top layer of the dual spin valve element 699. Reference numbers not specifically identified in FIG. 6 correspond to those reference numbers previously defined in subsequent Figs.

Referring to FIG. 6, prior art dual spin valve sensors having two self pinned spin valves 600, such the one shown in FIG. 6, are disadvantaged because of the instability of the biasing for the dual spin valve element 699. The self pinned layers 616, 624 are highly susceptible to demagnetizing fields. The pinning field can be reversed in the presence of the sense current induced magnetic field or other magnetic fields which may interact with the self pinned fields.

The present invention provides increased magnetic field sensitivity by combining a sensitive self pinned spin valve with a strong biasing anti-ferromagnetic spin valve, i.e., the dual spin valve sensor of the present invention provides increased ΔR/R and high sensitivity while maintaining stable biasing in the presence of induced magnetic fields.

Figure 7:
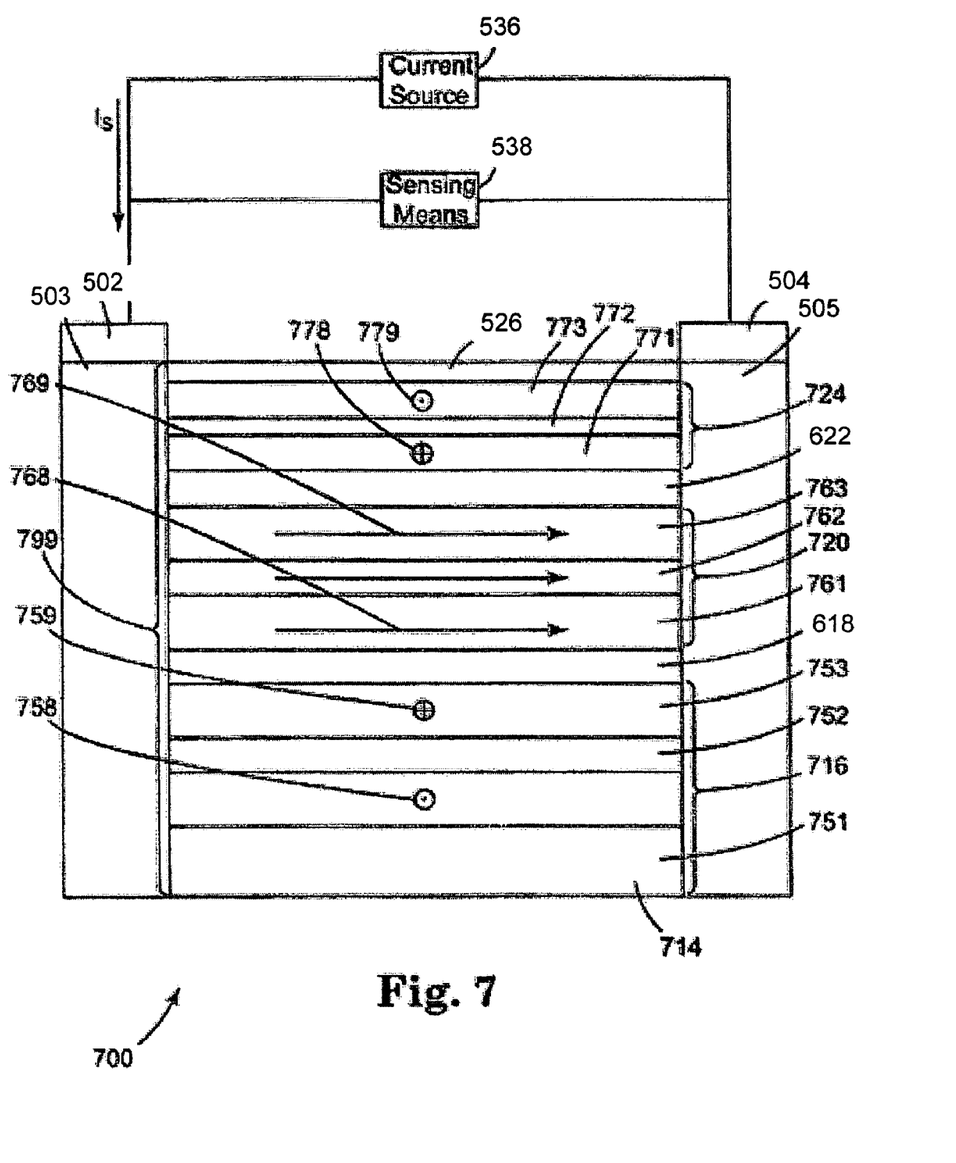
FIG. 7 is a cross sectional view illustrating an embodiment of a dual spin valve sensor according to the present invention.

Now, with reference to FIG. 7, an air bearing surface (ABS) view of an asymmetric dual spin valve sensor 700, according to another embodiment of the present invention, is disclosed. The external structure of the dual spin valve sensor bounding the dual spin valve element 799 may be identical to that disclosed in FIG. 5 and will not be repeated.

The structures of composite layers 716, 720 and 724 will now be disclosed. The exchange coupling pinned layer 716 is a composite layer including CoFe 751, Ru 752 and CoFe 753. The layer of CoFe 751 has a magnetic moment 758 oriented out of the page, as shown in FIG. 7, due to exchange coupling with anti-ferromagnetic layer 714. The layer Ru 752 (an anti-parallel coupling layer) cooperates with layer CoFe 753 causing anti-parallel coupling of the magnetic moments (758 and 759, respectively) of layers CoFe 751 and CoFe 753.

The composite free layer 720 includes CoFe 761, NiFe 762 and CoFe 763. In the properly biased condition, layer CoFe 761 and CoFe 763 having magnetic moments 768 and 769, respectively, perpendicular to the magnetic moments of the pinned layers.

The self-pinned layer 724 is a composite layer including CoFe 771, Ru 772 and NiFe 773. The layer of CoFe 771 has a magnetic moment 778 oriented into of the page, as shown in FIG. 7. The layer Ru 772 (an anti-parallel coupling layer) cooperates with layer NiFe 773 causing anti-parallel coupling of the magnetic moments (778 and 779, respectively) of layers CoFe 771 and NiFe 773.

The magnetic moments 778 and 779 are self pinned through the sense current and magnetostriction, and the additional contribution of an added antiparallel coupling layer 772. The anti-parallel coupling layer increases the magnetic anisotropy through anti-parallel coupling the layers 771 and 773. The thickness of the respective layers 771 and 773 also contributes to increasing the magnetic anisotropy of the self pinned composite layer 724. The self pinned composite layer does not have and does not require an adjacent anti-ferromagnetic layer to cause pinning because the magnetic moments of the self pinned layer are oriented at least due to the sense current and magnetostriction.

Alternatively, the second ferromagnetic self pinned layer may be a composite layer of CoFeO and NiFeO, instead of CoFe and NiFe. Reference numbers not specifically identified in FIG. 7 correspond to those reference numbers previously defined in subsequent Figs.

The dual spin valve sensor 700 of the instant invention includes two composite pin layers 716, 724. Sandwiched between the two composite layers is the center composite free layer 720. Here it is pointed out, with reference to FIG. 7, that the exchange coupling pinned layer 716 is disposed on the first anti-ferromagnetic pinning layer 714. The exchange coupling pinned layer is pinned through exchange coupling with the first anti-ferromagnetic pinning layer 714. The exchange coupling pinned layer has a net magnetic moment oriented in accordance with the strength of the pinning field.

The self-pinned layer 724 has a net magnetic moment oriented in accordance with the induced fields from the applied sensing current. The magnetic field associated with the self-pinned layer 724 also works cooperatively with the anti-ferromagnetically pinned layer 716 to form a flux closure around the free layer structure 720 in the central sensing region.

Figure 8:
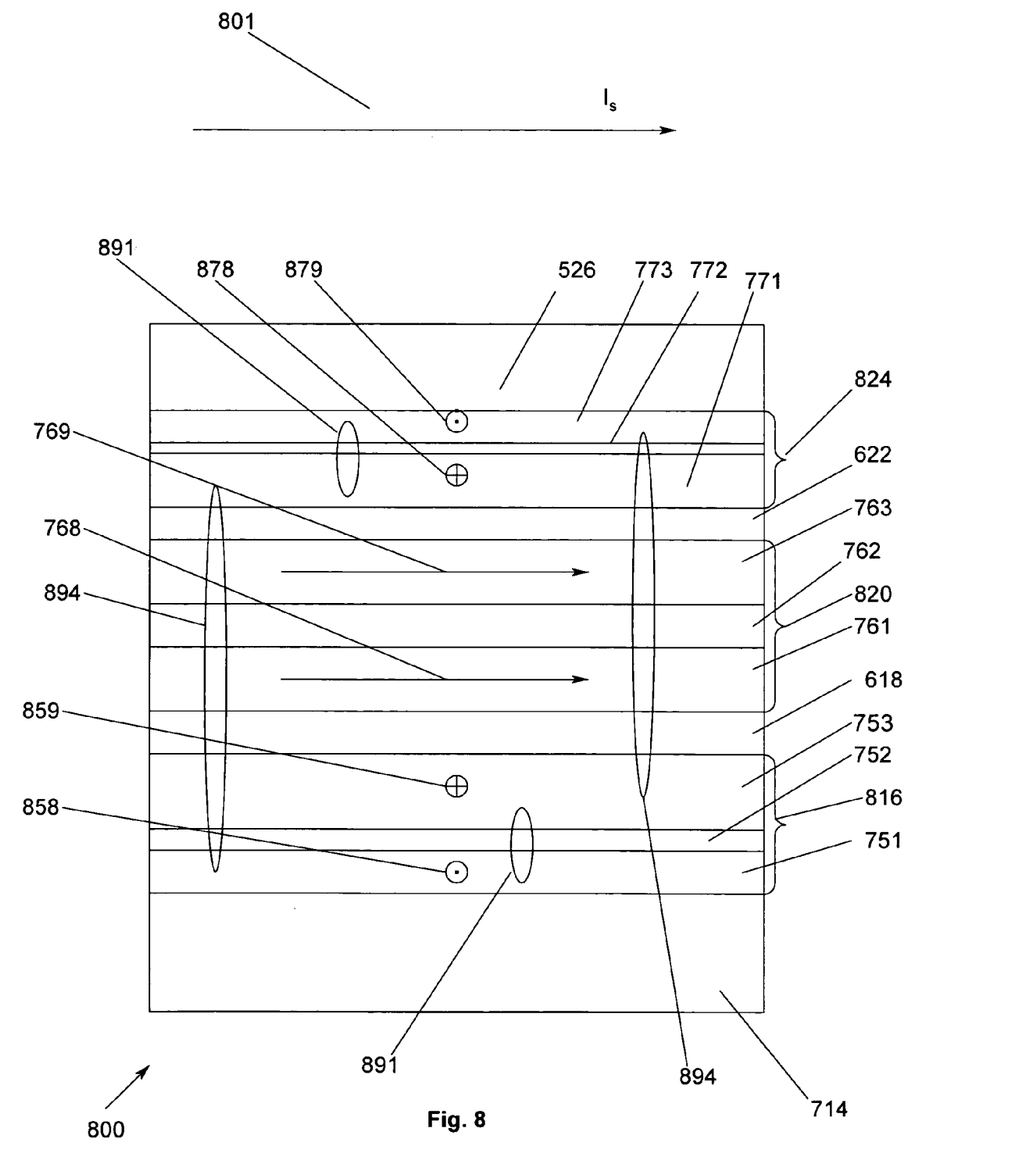
FIG. 8 illustrates cross sectional view of a dual spin valve element according to the invention showing the orientation of the pinned magnetic moments and the direction of the sense current cooperating to form the flux closure.

FIG. 8 illustrates cross sectional view of a dual spin valve element 800 according to the invention, which shows the orientation of the pinned magnetic moments 858, 859, 878 and 879, (into and out of the page, respectively) and the direction of the sense current 801 (left to right) cooperating to form a flux closure shown generally surrounding the free layer 820. The magnetic field lines (891 and 894), emanating from the sense current direction 801 act constructively with the magnetic fields associated with pinned magnetic moments 858, 859, 878 and 879. Reference numbers not specifically identified in FIG. 8 correspond to those reference numbers previously defined in subsequent Figs.

Figure 9:
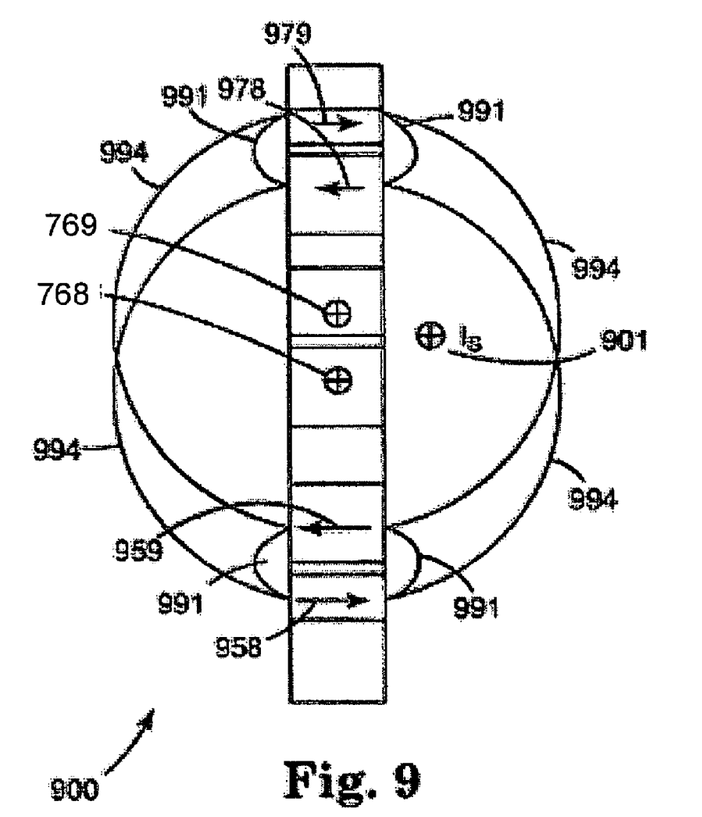
FIG. 9 illustrates a side cross sectional view of a dual spin valve element according to the invention showing the orientation of the pinned magnetic moments and the direction of the sense current cooperating to form the flux closure.

FIG. 9 illustrates a side cross sectional view of a dual spin valve element 900 according to the invention, which shows the orientation of the pinned magnetic moments 958, 959, 978 and 979, (pointing from left to right and pointing from right to left) and the direction of the sense current 901 (into the page) cooperating to form the flux closure shown generally surrounding the free layer. The magnetic field lines (991 and 994), emanating from the sensing current 901 act constructively with the magnetic fields associated with pinned magnetic moments 958, 959, 978 and 979 to form the flux closure around the free layer in the sensing region. Reference numbers not specifically identified in FIG. 9 correspond to those reference numbers previously defined in subsequent Figs.

Referring to both FIGS. 8 and 9, magnetizations (magnetic moments, 858, 859, 878, 879, 958, 959, 978 and 979, respectively), are oriented along prescribed directions. The magnetic moments (858, 859, 878, 879, 958, 959, 978 and 979, respectively) of the two pinned layers (816 and 824, respectively) are aligned, and point in same directions, i.e., they are parallel (symmetric).

The magnetic moments 858, 859, 878, 879, 958, 959, 978 and 979, of the two pinned layers are oriented parallel to one another as illustrated in FIGS. 8 and 9. The magnetic fields arising from the parallel magnetic moments 858, 859, 878, 879, 958, 959, 978 and 979, reinforce each other at the central sensing region of the ferromagnetic free layer structure (820) forming a flux guiding area shown generally in FIGS. 8 and 9.

Allowing the sense current $I_s$ to flow along a direction 801, 901 such that the sense current $I_s$ reinforces flux guiding shown generally in FIGS. 8 and 9 (the direction 801, 901 of the sense current $I_s$ being aligned with and corresponding to the direction of the magnetic field lines 891, 894, 991 and 994, respectively, corresponding to the magnetic moments 858, 859, 878, 879, 958, 959, 978 and 979), causing the dual spin valve GMR sensor to be self-biased, and the self biasing remains stable in the presence of magnetic flux interactions.

In the symmetric (parallel) dual spin valve element of the present invention (800 and 900, respectively), the free layer 820 is free from demagnetizing fields arising from the pinned layers (816 and 824).

As illustrated in FIGS. 8 and 9, the magnetic moments (858, 859, 878, 879, 958, 959, 978 and 979, respectively) are assumed to have opposite sign, but identical magnitude resulting in the dual spin valve element (800 and 900) being self biased, i.e., the demagnetizing fields arising from the pinned outer magnetic layers 816, 824 reinforce each other in the region of the free layer 820.

The magnetizations of the outer layers 816, 824 form a flux enclosure or guide surrounding the free layer 820 shown generally in FIG. 8. When the sense current $I_s$ in the free layer 820 flows in the direction such that it reinforces the flux enclosure formed by the layers, rather than opposing it, the self biasing is made stable and efficient.

The magnetic field induced by the sense current $I_s$ also reinforces the pinning of the magnetic moment of the self pinned layers, especially in cases where the sense current is large. Large sense currents may produce induced magnetic fields several times larger than the magnetic fields emanating from the pinned layers. The result is a very stable biased free layer and a sensitive spin valve sensor with large ΔR/R.

The ferromagnetic free layer structure (720 and 820, respectively) lies within the generally shown flux closure area and is free from demagnetizing fields. A strong flux closure formed by the present invention ensures a well biased sensor. Good biasing demonstrated by the present invention causes significant increased sensitivity to sensed magnetic flux interactions.

Further advantages are gained through arrangement and construction of the second ferromagnetic self pinned layer (724 and 824, respectively). The second ferromagnetic self-pinned layer (724 and 824, respectively) may be a composite layer including at least CoFe or CoFeO (771) and NiFe, NiFeO or CoFeNb (773), and further, wherein the CoFe or CoFeO layer is thicker than the NiFe, NiFeO or CoFeNb layer. Having the CoFe or CoFeO layer thicker than the NiFe, NiFeO or CoFeNb layer causes signal addition to take place, thus in effect amplifying the magnetic flux signal sensed from the magnetic media. An overall result of the construction of the self pinned layer (724 and 824, respectively) described above is increased ΔR/R (sensitivity) of the dual spin valve sensor that allows the sensor to detect more minute magnetic flux interactions which allows magnetic media to be more densely packed with data.

The combination of a sensitive self pinned spin valve (724 and 824, respectively) with an anti-ferromagnetic spin valve (716 and 816, respectively), as disclosed herein, produces a dual spin valve sensor with increased ΔR/R featuring high sensitivity while maintaining stable biasing in the presence of induced magnetic fields.

The elimination of one exchange coupled layer by the present invention, considerably reduces the overall thickness of dual spin valve element, which results in increased sheet resistance, a greater GMR ratio and increased sensitivity to detected magnetic flux, over prior art sensors having two exchange coupled spin valves, as shown in FIG. 5. The implementation of one exchange coupled spin valve provides desired stable biasing of the free layer, over prior art sensors having two self pinned spin valves, as shown in FIG. 6. The implementation of one self pinned spin valve provides improved sensitivity, over prior art sensors having two exchange coupled spin valves, as shown in FIG. 5.

As mentioned above, the present invention provides a method and apparatus for providing enhanced giant magnetoresistance (GMR) effects by forming a GMR head including dual spin valves being formed of composite thin film layers and having a composite thin film free layer sandwiched between the spin valves, the second of the two spin valves being self-pinned.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for forming a dual spin valve sensor having increased sensitivity, comprising forming a first composite pinned layer, the first composite pinned layer being exchange coupled via an anti-ferromagnetic layer;

forming a second composite pinned layer, the second composite pinned layer being self pinned to eliminate a need for an anti-ferromagnetic layer to reduce a thickness of the dual spin valve sensor, wherein the second composite pinned layer comprises at least first and second anti-parallel coupled self pinned sub-layers; and forming a composite free layer disposed between the first and second composite pinned layers.

2. The method of claim 1 wherein the composite free layer comprises outer free layers with moments perpendicular to moments of the first and second composite pinned layers.

3. The method of claim 1, wherein pinning of the moment of the second composite pinned layer is reinforced through magnetostriction to provide stable pinning of the moment.

4. The method of claim 1, wherein pinning of the moment of the second composite pinned layer is reinforced to provide stable pinning of the moment upon the application of a sense current flowing through the composite free layer.

5. The method of claim 1, wherein the anti-ferromagnetic layer is selected from the group consisting of PtMn, IrMn, FeMn and NiMn, the anti-ferromagnetic layer providing strong exchange coupling with the first composite pinned layer.

6. The method of claim 1, wherein the first composite pinned layer comprises layers of CoFe/Ru/CoFe, wherein the CoFe layer nearer the composite free layer is thicker than the CoFe layer farther away from the composite free layer to provide signal addition for increased sensitivity.

7. The method of claim 1, wherein the second composite pinned layer comprises a first, a second layer, and a third layer, wherein the first layer is thicker than the second layer and the third layer, and wherein the first layer is nearer the composite free layer than the second layer and the third layer to provide signal addition for increased sensitivity.

8. The method of claim 1, wherein the second composite pinned layer comprises layers of CoFe/Ru/NiFe, wherein the CoFe layer is thicker than the NiFe layer, and wherein the CoFe layer is nearer the composite free layer than the NiFe layer to provide signal addition for increased sensitivity.

9. The method of claim 1, wherein the second composite pinned layer comprises layers of CoFe/NiFe, wherein the CoFe layer is thicker than the NiFe layer, and wherein the CoFe layer is nearer the composite free layer than the NiFe layer to provide signal addition for increased sensitivity.

10. The method of claim 1, wherein the second composite pinned layer comprises layers of CoFeO/Ru/NiFeO, wherein the CoFeO layer is thicker than the NiFeO layer, and wherein the CoFeO layer is nearer the composite free layer than the NiFeO layer to provide signal addition for increased sensitivity.

11. The method of claim 1, wherein the second composite pinned layer comprises layers of CoFeO/NiFeO, wherein the CoFeO layer is thicker than the NiFeO layer, and wherein the CoFeO layer is nearer the composite free layer than the NiFeO layer to provide signal addition for increased sensitivity.

12. The method of claim 1, wherein the second composite pinned layer comprises layers of CoFe/Ru/CoFeNb, wherein the CoFe layer is nearer the composite free layer than the CoFeNb layer for providing increased sensitivity.

13. The method of claim 1, wherein the second composite pinned layer comprises layers of CoFe/CoFeNb, and wherein the CoFe layer is nearer the composite free layer than the CoFeNb layer for providing increased sensitivity.

14. The method of claim 1, wherein the composite free layer comprises layers of CoFe/NiFe/CoFe to provide increased sense current flow.

15. A dual spin valve sensor comprising:
an anti-ferromagnetic layer;
a first composite pinned layer being exchange coupled via the anti-ferromagnetic layer;
a second composite pinned layer, the second composite pinned layer being self pinned to eliminate a need for an anti-ferromagnetic layer to reduce a thickness of the dual spin valve sensor, wherein the second composite pinned layer comprises at least first and second anti-parallel coupled self pinned sub-layers; and
a composite free layer disposed between the first and second composite pinned layers.

16. The sensor of claim 15 wherein the composite free layer comprises outer free layers with moments perpendicular to moments of the first and second composite pinned layers.

17. The sensor of claim 15, wherein a moment of the second composite pinned layer is reinforced through magnetostriction to provide stable pinning of the moment.

18. The sensor of claim 15, wherein a moment of the second composite pinned layer is reinforced to provide stable pinning of the moment upon the application of a sense current flowing through the composite free layer.

19. The sensor of claim 15, wherein the anti-ferromagnetic layer is selected from the group consisting of PtMn, IrMn, FeMn and NiMn, the anti-ferromagnetic layer providing strong exchange coupling with the first composite pinned layer.

20. The sensor of claim 15, wherein a first layer of the second composite pinned layer is thicker than a second layer and a third layer, and wherein the first layer is nearer the composite free layer than the second layer and the third layer to provide signal addition for increased sensitivity.

21. The sensor of claim 15, wherein the first composite pinned layer comprises layers of CoFe/Ru/CoFe, wherein the CoFe layer nearer the composite free layer is thicker than the CoFe layer farther away from the composite free layer to provide signal addition for increased sensitivity.

22. The sensor of claim 15, wherein the second composite pinned layer comprises layers of CoFe/Ru/NiFe, wherein the CoFe layer is thicker than the NiFe layer, and wherein the CoFe layer is nearer the composite free layer than the NiFe layer to provide signal addition for increased sensitivity.

23. The sensor of claim 15, wherein the second composite pinned layer comprises layers of CoFe/NiFe, wherein the CoFe layer is thicker than the NiFe layer, and wherein the CoFe layer is nearer the composite free layer than the NiFe layer to provide signal addition for increased sensitivity.

24. The sensor of claim 15, wherein the second composite pinned layer comprises layers of CoFeO/Ru/NiFeO, wherein the CoFeO layer is thicker than the NiFeO layer, and wherein the CoFeO layer is nearer the composite free layer than the NiFeO layer to provide signal addition for increased sensitivity.

25. The sensor of claim 15, wherein the second composite pinned layer comprises layers of CoFeO/NiFeO, wherein the CoFeO layer is thicker than the NiFeO layer, and wherein the CoFeO layer is nearer the composite free layer than the NiFeO layer to provide signal addition for increased sensitivity.

26. The sensor of claim 15, wherein the second composite pinned layer comprises layers of CoFe/Ru/CoFeNb, wherein the CoFe layer is nearer the composite free layer than the CoFeNb layer for providing increased sensitivity.

27. The sensor of claim 15, wherein the second composite pinned layer comprises layers of CoFe/CoFeNb, and wherein the CoFe layer is nearer the composite free layer than the CoFeNb layer for providing increased sensitivity.

28. The sensor of claim 15, wherein the composite free layer comprises layers of CoFe/NiFe/CoFe to provide increased sense current flow and increased sensitivity.

29. A magnetic storage system, comprising:
a magnetic recording medium; and
a dual spin valve sensor operatively coupled proximate the recording medium, the dual spin valve sensor, comprising
an anti-ferromagnetic layer;
a first composite pinned layer being exchange coupled via the anti-ferromagnetic layer;
a second composite pinned layer, the second composite pinned layer being self pinned to eliminate a need for an anti-ferromagnetic layer to reduce a thickness of the dual spin valve sensor wherein the second composite pinned layer comprises at least first and second anti-parallel coupled self pinned sub-layers—has; and
a composite free layer disposed between the first and second composite pinned layers.

30. The system of claim 29 wherein the composite free layer comprises outer free layers with moments perpendicular to moments of the first and second composite pinned layers.

31. The system of claim 29, wherein the second composite pinned layer comprises a moment, the moment of the second composite pinned layer is reinforced through magnetostriction to provide stable pinning of the moment.

32. The system of claim 29, wherein the second composite pinned layer comprises a moment, the moment of the second composite pinned layer is reinforced to provide stable pinning of the moment upon the application of a sense current flowing through the composite free layer.

33. The system of claim 29, wherein the anti-ferromagnetic layer is selected from the group consisting of PtMn, FeMn, FeMn and NiMn, the anti-ferromagnetic layer provides strong exchange coupling with the first composite pinned layer.

34. The system of claim 29, wherein a first layer of the second composite pinned layer is thicker than a second layer and a third layer and wherein the first layer is nearer the composite free layer than the second layer and a third layer to provide signal addition for increased sensitivity.

35. The system of claim 29, wherein the composite free layer comprises layers of CoFe/NiFe/CoFe to provide increased sense current flow and increased sensitivity.

* * * * *

UNITED STATES PATENT AND TRADEMARK OFFICE
CERTIFICATE OF CORRECTION

PATENT NO.        : 7,038,889 B2
APPLICATION NO. : 10/260971
DATED              : May 2, 2006
INVENTOR(S)       : Freitag et al.

Page 1 of 1

It is certified that error appears in the above-identified patent and that said Letters Patent is hereby corrected as shown below:

Column 5, Line 56:   replace "Is" with --$I_s$--
Column 12, Line 31:  delete "—"
Column 12, Line 32:  delete "has"
Column 12, Line 50:  replace first "FeMn" with --IrMn--
Column 12, Line 55:  replace "layer" with --layer,--
Column 12, Line 56:  replace "a" with --the--

Signed and Sealed this

Twenty-second Day of August, 2006

JON W. DUDAS
*Director of the United States Patent and Trademark Office*